(12) United States Patent
Kayano et al.

(10) Patent No.: US 10,263,311 B2
(45) Date of Patent: Apr. 16, 2019

(54) TRANSMISSION LINE AND SIGNAL PROCESSING DEVICE

(71) Applicant: Kabushiki Kaisha Toshiba, Minato-ku (JP)

(72) Inventors: Hiroyuki Kayano, Fujisawa (JP); Yuichi Sawahara, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/693,631

(22) Filed: Sep. 1, 2017

(65) Prior Publication Data

US 2018/0277917 A1 Sep. 27, 2018

(30) Foreign Application Priority Data

Mar. 21, 2017 (JP) ................ 2017-055009

(51) Int. Cl.
*H01P 1/30* (2006.01)
*H01P 3/08* (2006.01)
*H01P 7/08* (2006.01)
*H01P 1/203* (2006.01)
*H03H 11/04* (2006.01)
*G01R 33/035* (2006.01)
*H01L 39/02* (2006.01)
*H01L 39/04* (2006.01)

(52) U.S. Cl.
CPC ............ *H01P 1/30* (2013.01); *G01R 33/0354* (2013.01); *H01P 1/2039* (2013.01); *H01P 3/081* (2013.01); *H01P 3/085* (2013.01); *H01P 3/088* (2013.01); *H01P 7/082* (2013.01); *H03H 11/04* (2013.01); *H01L 39/02* (2013.01); *H01L 39/04* (2013.01)

(58) Field of Classification Search
CPC . H01P 1/30; H01P 3/081; H01P 7/082; H01L 39/04; H01L 39/02; H03H 11/04; G01R 33/0354
See application file for complete search history.

(56) References Cited

U.S. PATENT DOCUMENTS

2002/0187902 A1  12/2002  Kai et al.
2013/0057365 A1*  3/2013  Mizushima ............ H01P 1/047
                                                                  333/238
2015/0155848 A1*  6/2015  Yazaki ................ H01P 1/20345
                                                                  333/116

FOREIGN PATENT DOCUMENTS

JP    4236408    3/2009

* cited by examiner

Primary Examiner — John W Poos
(74) Attorney, Agent, or Firm — Oblon, McClelland, Maier & Neustadt, L.L.P.

(57) ABSTRACT

A transmission line according to an embodiment, includes a first conductor layer, a second conductor layer spaced apart from the first conductor layer, a first conductor line including a first region facing the first conductor layer and a second region facing the second conductor layer, the first conductor line being spaced apart from the first conductor layer and the second conductor layer, the first conductor line extending in a first direction, and a second conductor line spaced apart from the first conductor layer, the second conductor layer, and the first conductor line, the second conductor line extending in the first direction, the second conductor line being shorter than the first conductor line in the first direction in length.

17 Claims, 14 Drawing Sheets

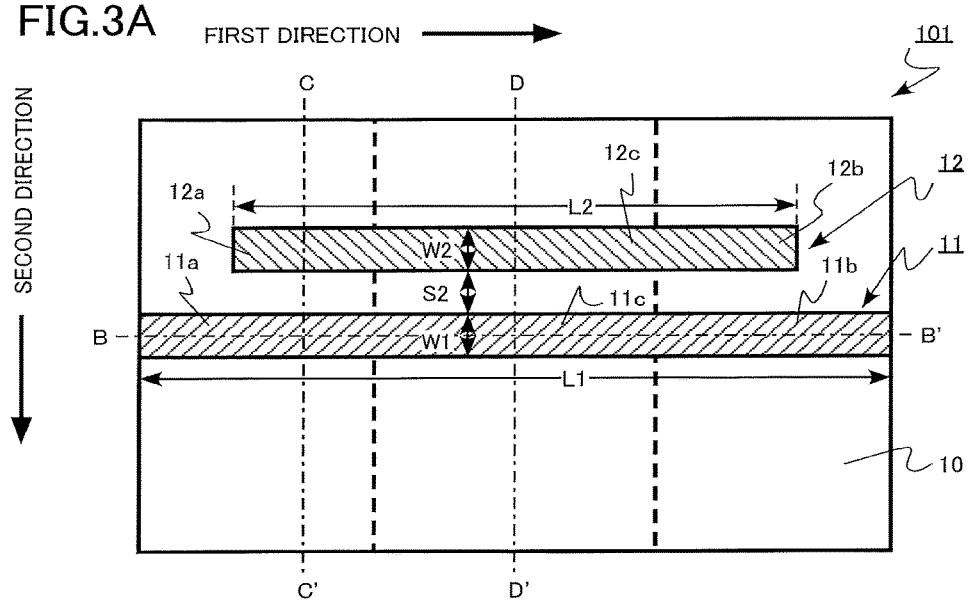
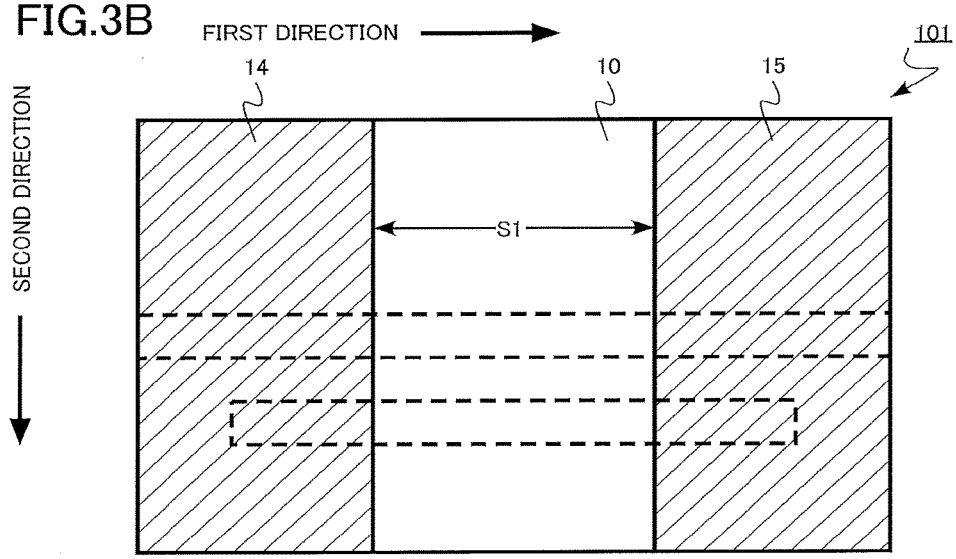

B-B' SECTION

C-C' SECTION

D-D' SECTION

FIG.7

|  | INSERTION LOSS (dB) | RADIATION LOSS (dB) | HEAT INTRUSION AMOUNT (mW) |
|---|---|---|---|
| FIRST COMPARATIVE EMBODIMENT | 0.27 | 0.02 | 100.20 |
| SECOND COMPARATIVE EMBODIMENT | 9.80 | 7.50 | 13.14 |
| FIRST EMBODIMENT | 1.26 | 0.98 | 24.75 |
| SECOND EMBODIMENT | 0.79 | 0.59 | 36.36 |
| THIRD EMBODIMENT | 0.270 | 0.084 | 45.90 |
| FOURTH EMBODIMENT | 0.272 | 0.079 | 32.79 |
| FIFTH EMBODIMENT | 0.268 | 0.080 | 32.22 |

FIG.10A  FIRST DIRECTION ⟶
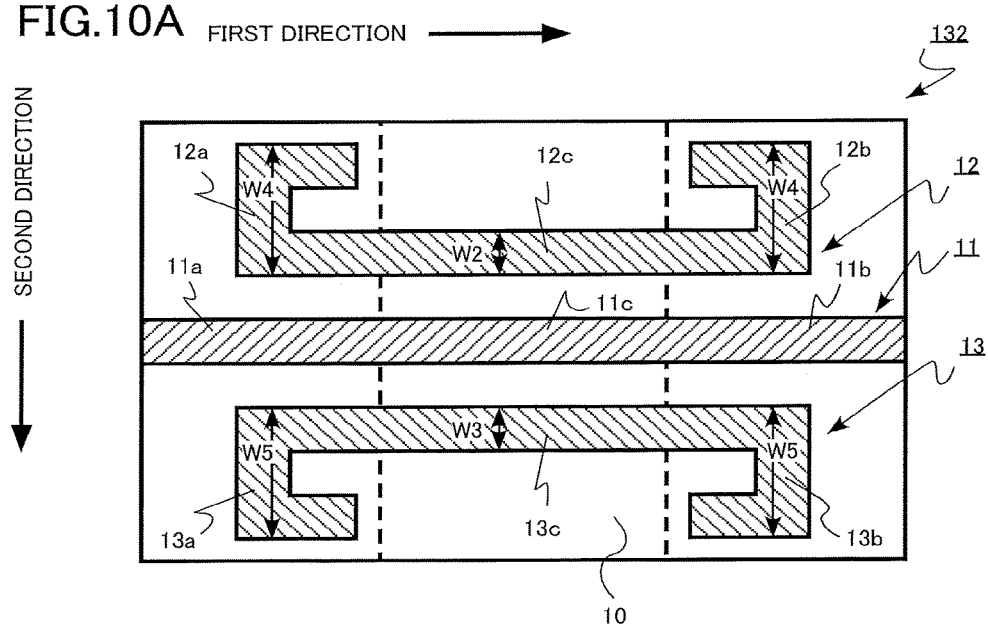
FIG.10B  FIRST DIRECTION ⟶
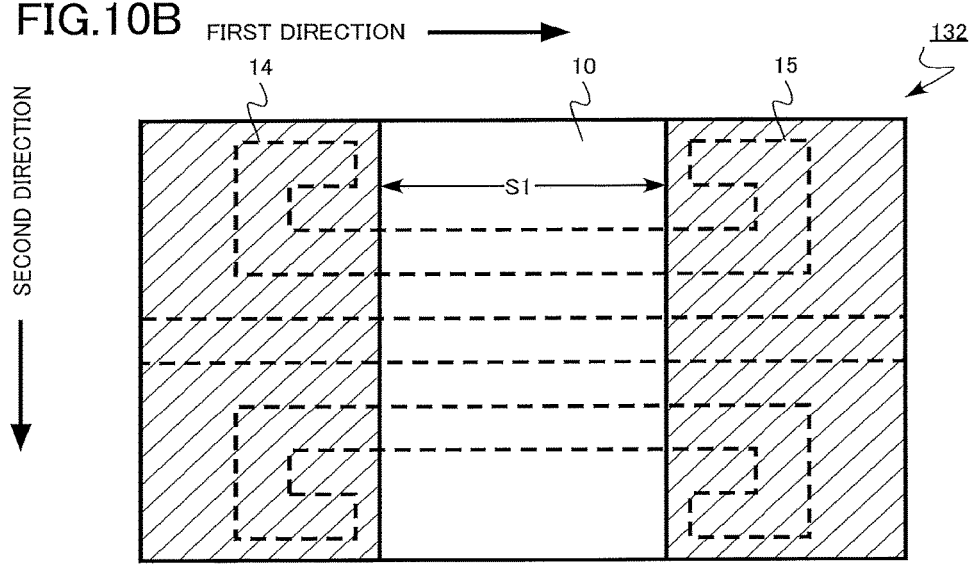

FIG.11A FIRST DIRECTION →
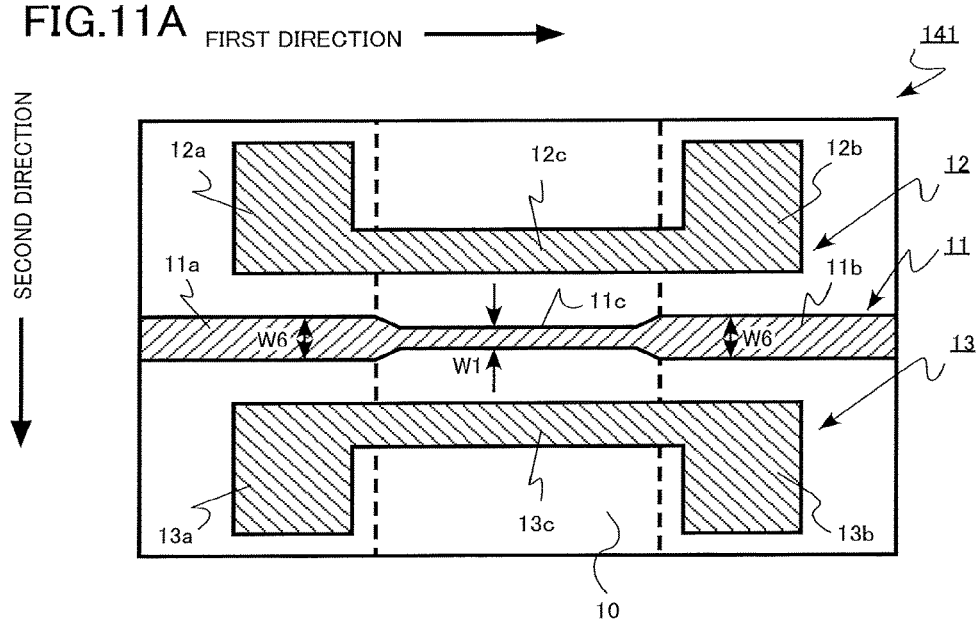
FIG.11B FIRST DIRECTION →
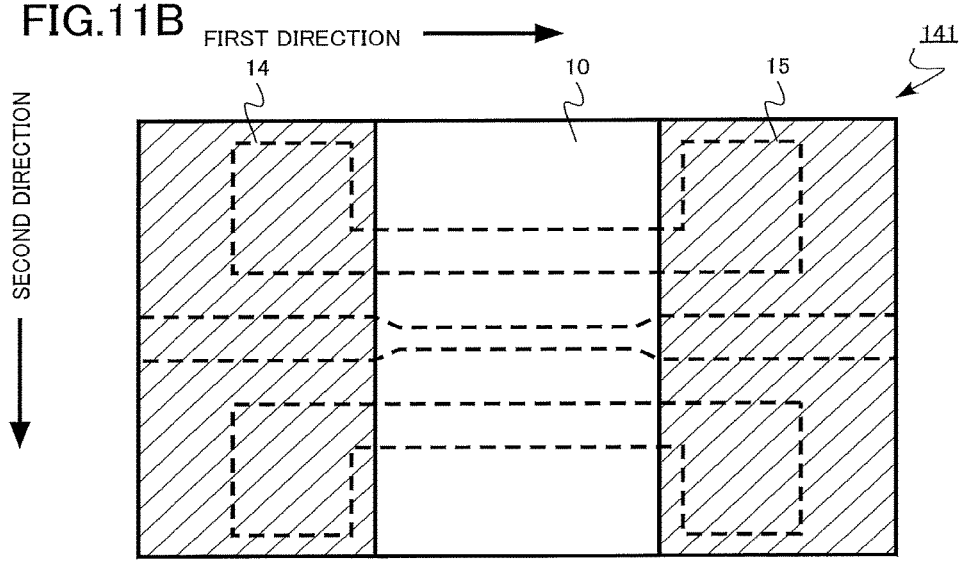

TRANSMISSION LINE AND SIGNAL PROCESSING DEVICE

CROSS-REFERENCE TO RELATED APPLICATION

This application is based upon and claims the benefit of priority from Japanese Patent Application No. 2017-055009, filed on Mar. 21, 2017, the entire contents of which are incorporated herein by reference.

FIELD

Embodiments described herein relate generally to a transmission line and a signal processing device.

BACKGROUND

A signal processing device that processes a signal input from an input line with an electronic circuit in a low temperature state or a high temperature state to output the signal from an output line, is desired to block heat between the outside and the signal processing device. For example, in a case where a superconducting filter that processes a signal at a low temperature is used as the electronic circuit, there is a risk that the load of a refrigerator increases in order to maintain the low temperature as a heat inflow from the outside increases. In addition, for example, in a case where a power amplifier that processes a signal at a high temperature is used for the electronic circuit, there is a risk that a characteristic of an electronic circuit provided outside degrades as a heat flow to the outside increases.

BRIEF DESCRIPTION OF THE DRAWINGS

FIGS. 3A and 3B are schematic views of a circuit portion of the transmission line according to the first embodiment;

FIG. 7 is a table illustrating simulation results of the loss and the heat intrusion amount of the transmission line according to the first embodiment;

FIGS. 10A and 10B are schematic views of a circuit portion of a transmission line according to a modification of the third embodiment;

FIGS. 11A and 11B are schematic views of a circuit portion of a transmission line according to a fourth embodiment;

DETAILED DESCRIPTION

A transmission line according to an embodiment, includes: a first conductor layer; a second conductor layer spaced apart from the first conductor layer; a first conductor line including a first region facing the first conductor layer and a second region facing the second conductor, the first conductor line being spaced apart from the first conductor layer and the second conductor layer, the first conductor line extending in a first direction; and a second conductor line spaced apart from the first conductor layer, the second conductor layer, and the first conductor line, the second conductor line extending in the first direction, the second conductor line being shorter than the first conductor line in the first direction in length.

Embodiments of the present disclosure will be described below with reference to the drawings. Note that, in the following descriptions, for example, the same members or similar members are denoted with the same reference signs. The descriptions of members, for example, that have been given once, will be appropriately omitted.

Transmission lines and signal processing devices according to the embodiments will be described below with reference to the drawings.

First Embodiment

A transmission line according to the present embodiment, includes a first conductor layer, a second conductor layer spaced apart from the first conductor layer, a first conductor line including a first region facing the first conductor layer and a second region facing the second conductor, the first conductor line being spaced apart from the first conductor layer and the second conductor layer, the first conductor line extending in a first direction, and a second conductor line spaced apart from the first conductor layer, the second conductor layer, and the first conductor line, the second conductor line extending in the first direction, the second conductor line being shorter than the first conductor line in the first direction in length.

Figure 1A:
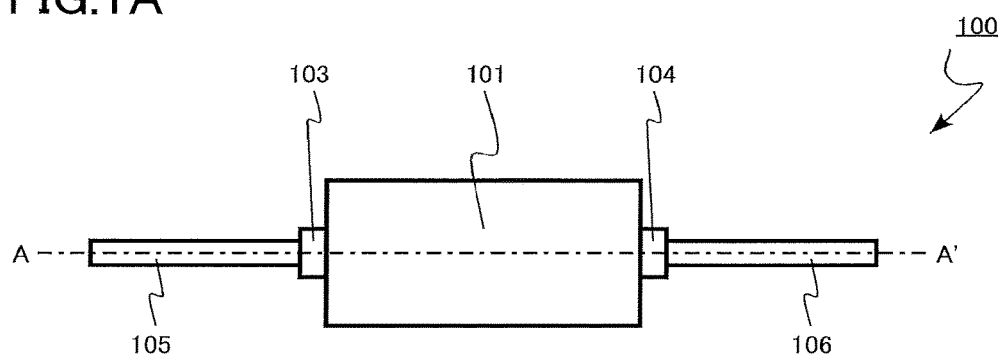
FIGS. 1A and 1B are overall views of a transmission line according to a first embodiment.
Figure 1B:
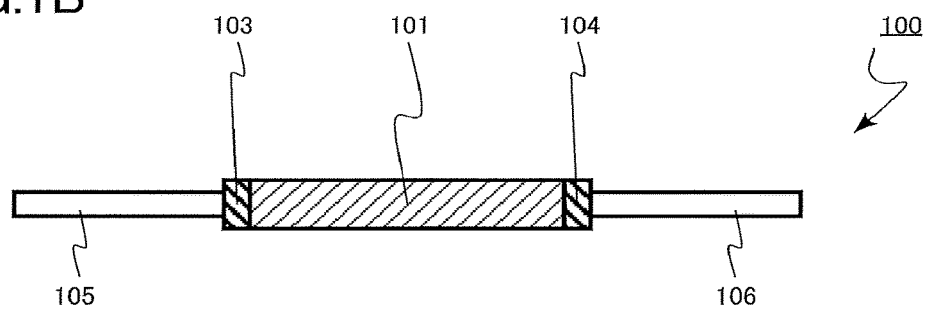

FIGS. 1A and 1B are overall views of the transmission line according to the present embodiment. FIG. 1A is a plan view, and FIG. 1B is a sectional view taken along line A-A' of FIG. 1A.

The transmission line 100 according to the present embodiment, includes a circuit portion 101, an input-side connecting portion 103, and an output-side connecting portion 104. The transmission line 100 according to the present embodiment, includes a heat insulating transmission line that blocks a heat inflow to an electronic circuit to be coupled or a heat outflow from the electronic circuit to be coupled.

The circuit portion 101 has, for example, a microstrip line structure. A strip line structure or a coplanar structure may be provided.

The input-side connecting portion 103 is provided at one end of the circuit portion 101, and the output-side connecting portion 104 is provided at the other end. For example, a coaxial cable 105 can be coupled to the input-side connecting portion 103 as an input line through which a high-frequency signal input from the outside to the circuit portion 101 is transmitted. In addition, for example, a coaxial cable 106 can be coupled to the output-side connecting portion 104 as an output line through which the high-frequency signal output from the circuit portion 101 to the outside is transmitted.

Figure 2A:
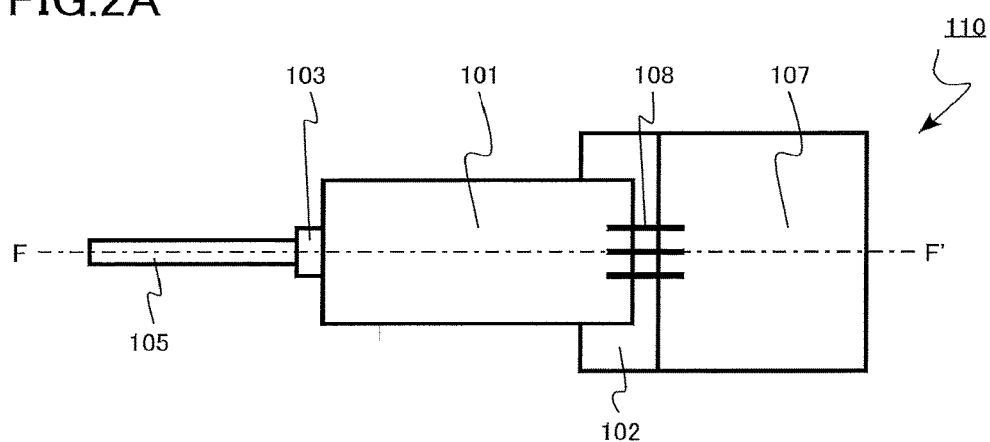
FIGS. 2A and 2B are overall views of a transmission line according to a modification of the first embodiment.
Figure 2B:
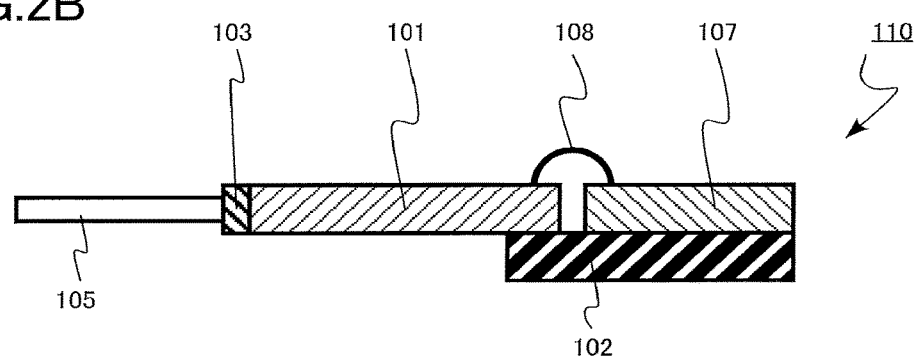

FIGS. 2A and 2B are overall views of a transmission line according to a modification of the present embodiment. FIG. 2A is a plan view, and FIG. 2B is a sectional view taken along line F-F' of FIG. 2A.

The transmission line 110 according to the modification is different from the transmission line 100 in FIGS. 1A and 1B in that no output-side connecting portion 104 is provided. For example, the transmission line 110 according to the modification is coupled to a circuit board 107 mounted on a supporting substrate 102, with a bonding wire 108. A high-frequency signal is transmitted from a circuit portion 101 to the circuit board 107 through the bonding wire 108.

Figure 4A:
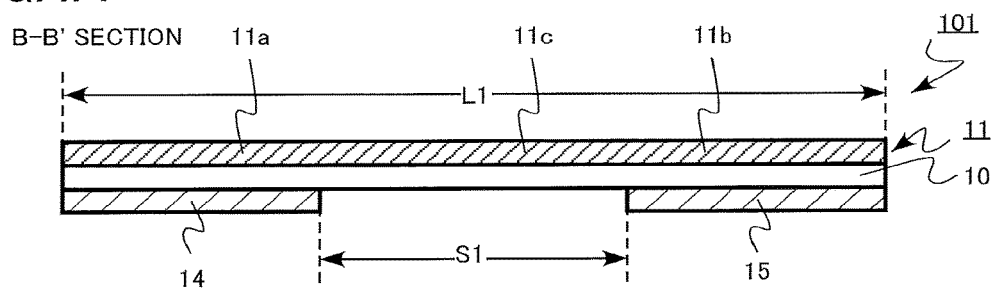
FIGS. 4A to 4C are schematic views of the circuit portion of the transmission line according to the first embodiment.
Figure 4B:
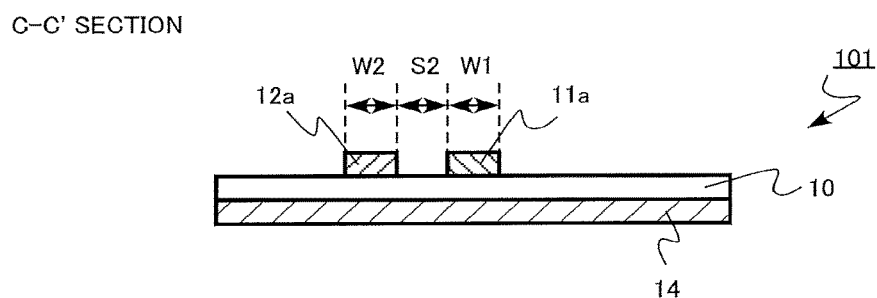
Figure 4C:
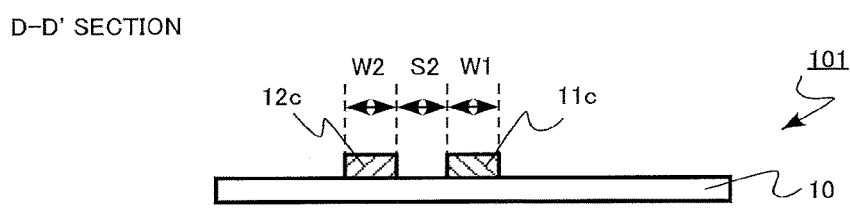

FIGS. 3A to 4C are schematic views of the circuit portion 101 of the transmission line 100 according to the present embodiment. FIGS. 3A and 3B are plan views, and FIGS. 4A to 4C are sectional views. FIG. 3A is a top view, and FIG. 3B is a bottom view. Note that, FIGS. 3A and 3B each also illustrate a member on the side of the opposite surface, with a broken line. FIGS. 4A, 4B, and 4C illustrate sections taken along line B-B', line C-C', and line D-D' of FIG. 3A, respectively.

The circuit portion 101 according to the present embodiment, includes a dielectric substrate 10, a conductor line 11 (the first conductor line), a first resonator 12 (the second conductor line), a first ground layer 14 (the first conductor layer), and a second ground layer 15 (the second conductor layer). The circuit portion 101 according to the present embodiment, has the microstrip line structure.

The dielectric substrate 10 includes an upper surface (a first surface) and a lower surface (a second surface) facing the upper surface. The dielectric substrate 10 includes, for example, a resin substrate. The thickness of the dielectric substrate 10 is, for example, between 25 µm and 2 mm. The length of the dielectric substrate 10 in the first direction is, for example, between 2 cm and 10 cm. The width of the dielectric substrate 10 in a second direction is, for example, between 1 cm and 5 cm.

The conductor line 11 and the first resonator 12 are located on the side of the upper surface of the dielectric substrate 10. The conductor line 11 and the first resonator 12 are provided in contact with the upper surface of the dielectric substrate 10. The first ground layer 14 and the second ground layer 15 are located on the side of the lower surface of the dielectric substrate 10. The first ground layer 14 and the second ground layer 15 are provided in contact with the lower surface of the dielectric substrate 10.

The conductor line 11, the first resonator 12, the first ground layer 14, and the second ground layer 15 each include a metal thin film. Examples of the metal thin film include a copper thin film and a silver thin film. The conductor line 11, the first resonator 12, the first ground layer 14, and the second ground layer 15 each are, for example, between 1 µm and 36 µm in film thickness.

The conductor line 11 is spaced apart from the first ground layer 14 and the second ground layer 15. The conductor line 11 extends in the first direction.

The conductor line 11 includes an input-side region 11a (the first region) facing the first ground layer 14 and an output-side region 11b (the second region) facing the second ground layer 15. An intermediate region 11c (a second intermediate region) not facing any of the first ground layer 14 and the second ground layer 15, is present between the input-side region 11a and the output-side region 11b in the conductor line 11.

An end portion of the input-side region 11a is coupled to, for example, the input-side connecting portion 103. An end portion of the output-side region 11b is coupled to, for example, the output-side connecting portion 104.

In the present specification, "the conductor line extending in the first direction has the regions facing the conductor layers" means that, in a case where a first face passing through an arbitrary point in each of the regions and being perpendicular to the first direction, intersects the conductor layer, the line segment having the shortest distance from the arbitrary point to the conductor layer is present in a face substantially the same as the first face.

The length (L1 in FIG. 3A) of the conductor line 11 in the first direction is equal to, for example, the length of the dielectric substrate 10 in the first direction. The width of the conductor line 11 in the second direction (W1 in FIG. 3A) is, for example, between 25 µm and 2 mm.

The first resonator 12 is spaced apart from the conductor line 11, the first ground layer 14, and the second ground layer 15. The first resonator 12 extends in the first direction. The length (L2 in FIG. 3A) of the first resonator 12 in the first direction is shorter than the length (L1) of the conductor line 11 in the first direction. The width (W2 in FIG. 3A) of the first resonator 12 in the second direction is, for example, between 25 µm and 2 mm.

The first resonator 12 includes an input-side region 12a (a third region) facing the first ground layer 14 and an output-side region 12b (a fourth region) facing the second ground layer 15. An intermediate region 12c (a first intermediate region) not facing any of the first ground layer 14 and the second ground layer 15, is present between the input-side region 12a and the output-side region 12b in the first resonator 12.

The first resonator 12 includes a both-sides open resonator electromagnetically coupled to the conductor line 11. The first resonator 12 includes, for example, a half-wavelength resonator.

The distance (S2 in FIG. 3A) in the second direction between the conductor line 11 and the first resonator 12 is, for example, smaller than the width (W1) of the conductor line 11 in the second direction.

The first ground layer 14 and the second ground layer 15 are spaced apart from each other. The circuit portion 101 includes a pair of the ground layers that has been physically separated from each other.

The first ground layer 14 and the second ground layer 15 are located in substantially the same plane substantially parallel to the first direction. According to the present embodiment, the first ground layer 14 and the second ground layer 15 are located in contact with the lower surface of the dielectric substrate 10.

The first ground layer 14 and the second ground layer 15 are fixed at a ground potential. The distance in the first direction (S1 in FIG. 3B) between the first ground layer 14 and the second ground layer 15 is, for example, shorter than the half wavelength of the signal transmitted to the conductor line 11.

Next, a function and an effect according to the present embodiment will be described.

A signal processing device that processes a signal input from an input line with an electronic circuit in a low temperature state or a high temperature state to output the signal from an output line, is desired to block heat between the outside and the signal processing device. For example, in a case where a superconducting filter that processes a signal at a low temperature is used as the electronic circuit, there is a risk that the load of a refrigerator increases in order to maintain the low temperature as a heat inflow from the outside increases. In addition, for example, in a case where a power amplifier that processes a signal at a high temperature is used as the electronic circuit, there is a risk that a characteristic of an electronic circuit provided outside degrades as a heat flow to the outside increases. Therefore, a heat insulating transmission line having low loss and an excellent heat insulating characteristic, is preferably inserted between the electronic circuit and the outside.

Figure 5A:
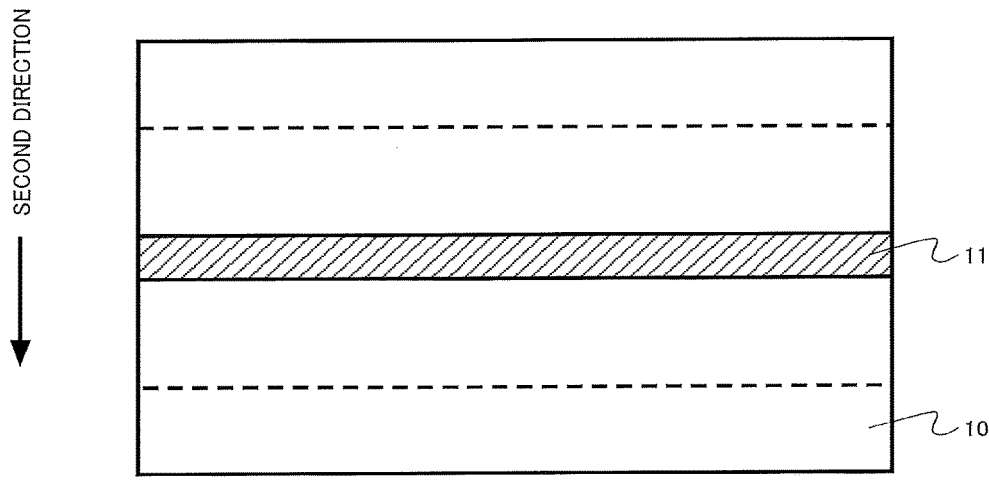
FIGS. 5A and 5B are schematic views of a circuit portion of a transmission line according to a first comparative embodiment.
Figure 5B:
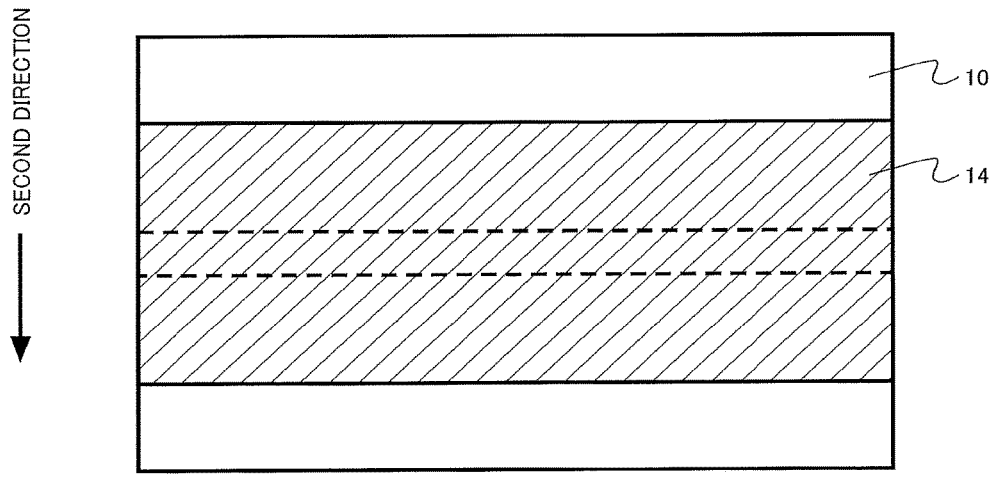

FIGS. 5A and 5B are schematic views of a circuit portion of a transmission line according to a first comparative embodiment. FIG. 5A is a top view, and FIG. 5B is a bottom view. FIGS. 5A and 5B each also illustrate a member on the side of the opposite surface, with a broken line.

The circuit portion according to the first comparative embodiment, includes a dielectric substrate 10, a conductor line 11, and a ground layer 14. The circuit portion according to the first comparative embodiment, has a microstrip line structure. The circuit portion according to the first comparative embodiment, includes the ground layer 14 that has not been separated. According to the first comparative embodiment, particularly, heat easily propagates through the ground layer 14 having a wide width and low thermal conductivity.

Figure 6A:
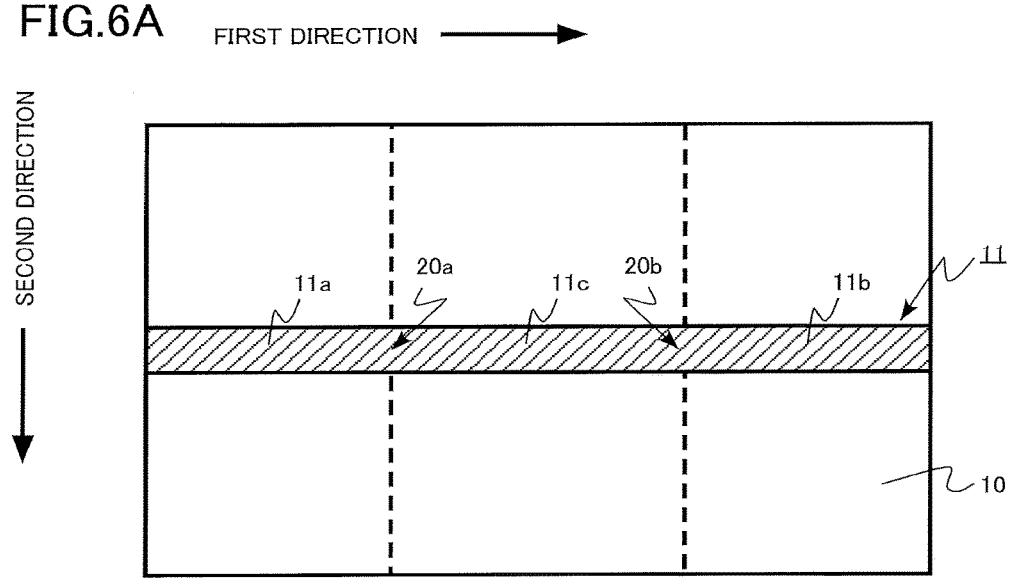
FIGS. 6A and 6B are schematic views of a circuit portion of a transmission line according to a second comparative embodiment.
Figure 6B:
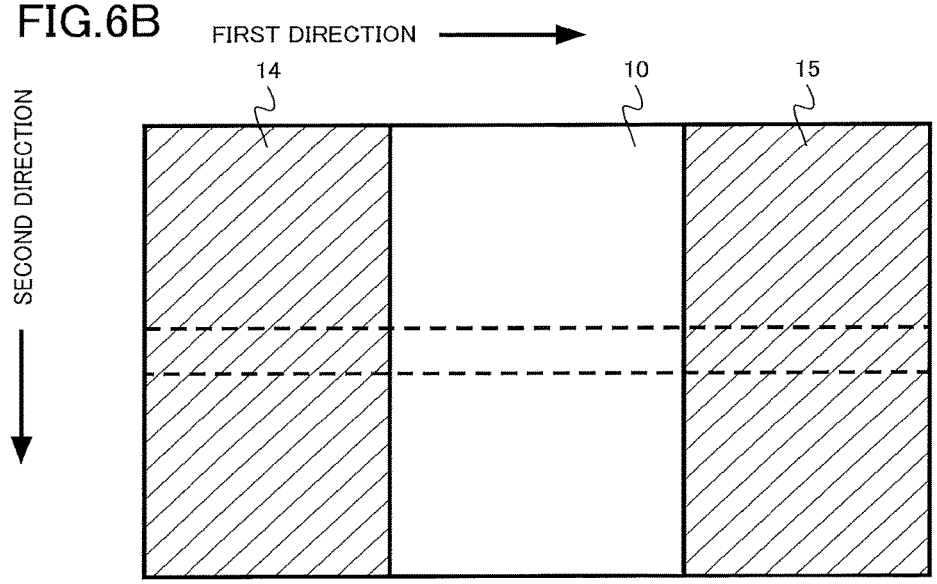

FIGS. 6A and 6B are schematic views of a circuit portion of a transmission line according to a second comparative embodiment. FIG. 6A is a top view, and FIG. 6B is a bottom view. Note that, FIGS. 6A and 6B each also illustrate a member on the side of the opposite surface, with a broken line. The circuit portion according to the second comparative embodiment, includes a dielectric substrate 10, a conductor line 11, a first ground layer 14, and a second ground layer 15. The circuit portion according to the second comparative embodiment, has a microstrip line structure. The circuit portion according to the second comparative embodiment, is different from the circuit portion 101 according to the present embodiment only in that no first resonator 12 is provided.

According to the second comparative embodiment, a ground layer dominantly functioning as a propagation path for heat is separated into two so that a heat inflow or a heat outflow through the transmission line is inhibited. However, separating the ground layer into the two causes a first impedance discontinuous portion 20a and a second impedance discontinuous portion 20b. Therefore, the radiation loss of the transmission line increases.

More specifically, resonance occurs in the conductor line 11 between the first impedance discontinuous portion 20a and the second impedance discontinuous portion 20b and then energy is radiated into space so that the radiation loss increases. In other words, the formation of the first impedance discontinuous portion 20a and the second impedance discontinuous portion 20b causes electromagnetic field radiation so that the radiation loss increases.

In the transmission line 100 according to the present embodiment, similarly to the second comparative embodiment, the separation of a ground layer into two inhibits the heat inflow or the heat outflow through the transmission line. Furthermore, providing the first resonator 12 along the conductor line 11 can inhibit the radiation loss due to the first impedance discontinuous portion 20a and the second impedance discontinuous portion 20b.

The first resonator 12 includes the both-sides open resonator electromagnetically coupled to the conductor line 11. Coupling the first resonator 12 to the conductor line 11 to resonate, cancels the radiation of energy into space so that the radiation loss of the transmission line 100 is inhibited.

FIG. 7 is a table illustrating simulation results of the loss and the heat intrusion amount of the transmission line 100 according to the present embodiment. The loss indicates insertion loss and the radiation loss. The insertion loss is the sum of the radiation loss and conductor loss. The heat intrusion amount is the amount of heat propagating from one end portion of the transmission line to the other end portion.

FIG. 7 also illustrates simulation results according to the first and second comparative embodiments and simulation results according to second to fifth embodiments to be described later.

The ground layer is divided into two according to the second comparative embodiment in comparison to that according to the first comparative embodiment. As is apparent from FIG. 7, dividing the ground layer into the two drastically decreases the heat intrusion amount according to the second comparative embodiment. However, the formation of the two impedance discontinuous portions increases the radiation loss, resulting in a significant increase in the insertion loss.

The transmission line 100 according to the present embodiment (the first embodiment), includes the first resonator 12 added in comparison to that according to the second comparative embodiment. As is apparent from FIG. 7, adding the first resonator 12 cancels the radiation of the energy into the space so that the radiation loss drastically decreases. As a result, the insertion loss is also inhibited. Note that, it can be considered that the reason why the heat intrusion amount slightly increases in comparison to that according to the second comparative embodiment is that the propagation of heat through the first resonator 12 is added.

The transmission line 100 according to the present embodiment, can achieve an excellent heat insulating transmission line with low insertion loss and a heat intrusion amount inhibited.

Note that, parameters, such as the distance (S1) in the first direction between the first ground layer 14 and the second ground layer 15, the distance (S2) in the second direction between the conductor line 11 and the first resonator 12, the length (L2) of the first resonator 12 in the first direction, the width (W1) of the conductor line 11 in the second direction, and the width (W2) of the first resonator 12 in the second direction, are appropriately set in accordance with a characteristic required for the transmission line 100. For example, the setting is made with an exemplary procedure to be described later.

First, the distance in the second direction between the conductor line 11 and the first resonator 12 (hereinafter, referred to as an inter-line distance S2) is determined from a bandwidth and a heat intrusion amount that have been required. As the inter-line distance S2 shortens, the coupling between the conductor line 11 and the first resonator 12 strengthens so that the bandwidth widens. Meanwhile, the heat intrusion amount through the first resonator 12 increases as the inter-line distance S2 shortens. Therefore, there is a trade-off between the bandwidth and the heat intrusion amount.

When the inter-line distance S2 is determined, the degree of the coupling between the conductor line 11 and the first resonator 12 is determined so that a frequency perturbation amount Δf is determined. The frequency perturbation amount Δf is the difference between the resonance frequency $f_v$ of a resonator having a half wavelength ($\lambda_v/2$) equal to the distance in the first direction between the first ground layer 14 and the second ground layer 15 (hereinafter, referred to as an inter-ground distance S1) and the resonance frequency of a circuit including the first resonator 12, namely, the following expression is satisfied: $f_0=f_x-\Delta f$.

The inter-ground distance S1 is determined with respect to a resonance frequency $f_0$ that has been required, in consideration of the frequency perturbation amount $\Delta f$. Note that, when the wavelength of the resonance frequency $f_0$ is defined as $\lambda_0$, the following expression is satisfied: $\lambda_0 > \lambda_x$ on the basis of the following expression: $f_0=f_x-\Delta f$, so that the inter-ground distance S1 satisfies the following expression: $S1 < \lambda_0/2$. In other words, the inter-ground distance S1 of the transmission line 100 is shorter than the half wavelength ($\lambda_0/2$) of the signal transmitted through the conductor line 11.

The length (L2) of the first resonator 12 in the first direction is determined in accordance with the inter-ground distance S1. In addition, for example, the width (W1) of the conductor line 11 in the second direction and the width (W2) of the first resonator 12 in the second direction are determined in consideration of the trade-off between conduction loss due to line resistance and the heat intrusion amount.

For example, each of the parameters is determined with the procedure.

As described above, the distance (S2) in the second direction between the conductor line 11 and the first resonator 12 is preferably small from the viewpoint of broadening the bandwidth. For example, the distance (S2) in the second direction between the conductor line 11 and the first resonator 12 is preferably smaller than the width (W1) of the conductor line 11 in the second direction.

The transmission line 100 according to the present embodiment, can achieve a heat insulating transmission line having small insertion loss and an excellent heat insulating characteristic.

Second Embodiment

A transmission line according to the present embodiment, further includes: a third conductor line spaced apart from a first conductor layer, a second conductor layer, and a first conductor line, the third conductor line interposing the first conductor line between a second conductor line and the third conductor line, the third conductor line extending in a first direction, the third conductor line being shorter than the first conductor line in the first direction in length. The transmission line according to the present embodiment is similar to that according to the first embodiment except that the third conductor line is further provided. The descriptions of details that duplicate with respect to the first embodiment will be partially omitted below.

Figure 8A:
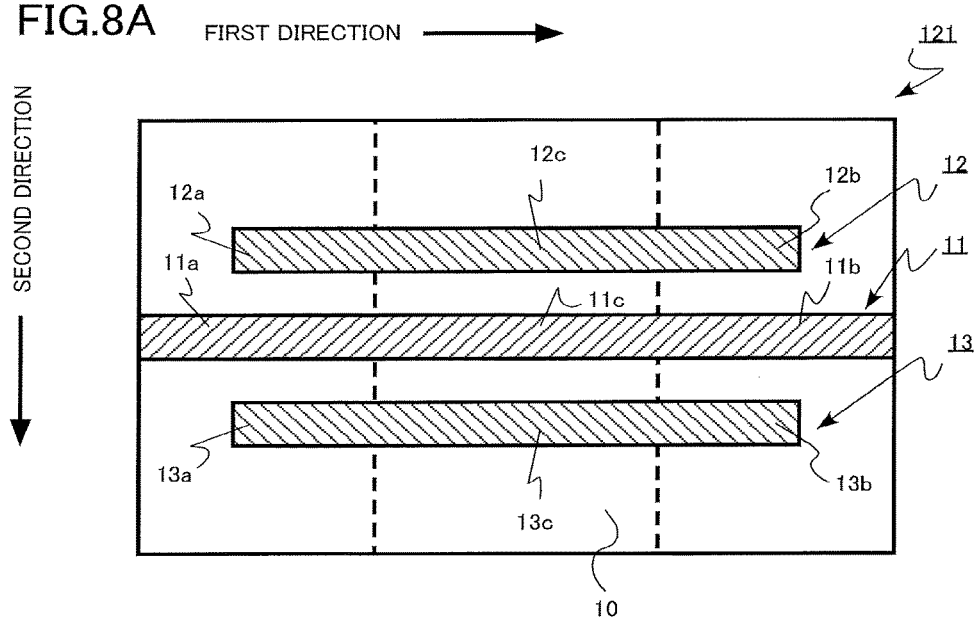
FIGS. 8A and 8B are schematic views of a circuit portion of a transmission line according to the second embodiment.
Figure 8B:
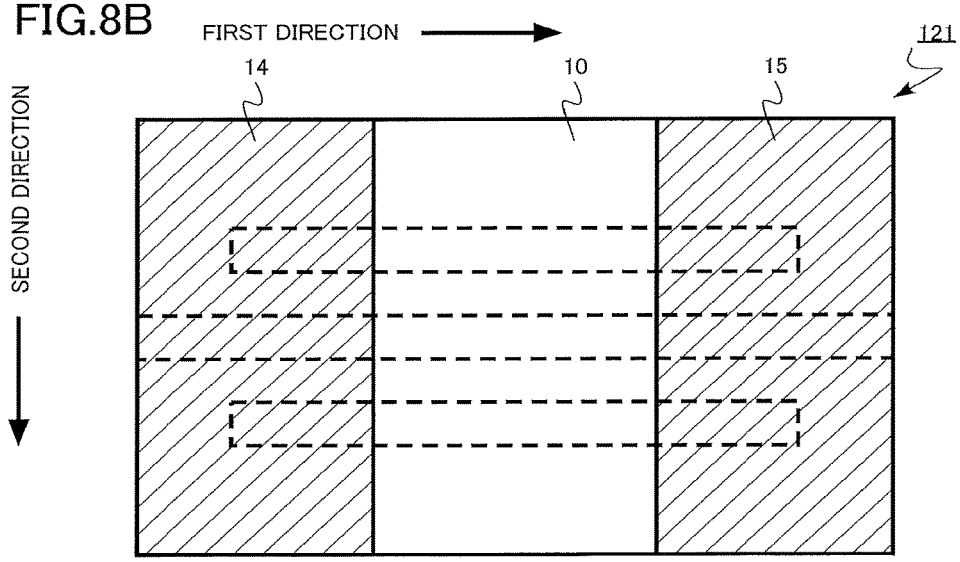

FIGS. 8A and 8B are schematic views of a circuit portion 121 of the transmission line according to the present embodiment. FIG. 8A is a top view, and FIG. 8B is a bottom view. FIGS. 8A and 8B each also illustrate a member on the side of the opposite surface, with a broken line.

The circuit portion 121 according to the present embodiment, includes a dielectric substrate 10, a conductor line 11 (the first conductor line), a first resonator 12 (the second conductor line), a second resonator 13 (the third conductor line), a first ground layer 14 (the first conductor layer), and a second ground layer 15 (the second conductor layer). The circuit portion 121 according to the present embodiment, has a microstrip line structure.

The second resonator 13 is spaced apart from the conductor line 11, the first ground layer 14, and the second ground layer 15. The second resonator 13 is provided to interpose the conductor line 11 between the first resonator 12 and the second resonator 13.

The second resonator 13 extends in the first direction. The length of the second resonator 13 in the first direction is shorter than the length of the conductor line 11 in the first direction. The width of the second resonator 13 in a second direction is, for example, between 25 µm and 2 mm.

The second resonator 13 includes an input-side region 13a facing the first ground layer 14 and an output-side region 13b facing the second ground layer 15. An intermediate region 13c not facing any of the first ground layer 14 and the second ground layer 15 is present between the input-side region 13a and the output-side region 13b in the second resonator 13.

The second resonator 13 includes a both-sides open resonator electromagnetically coupled to the conductor line 11. The second resonator 13 includes, for example, a half-wavelength resonator.

The distance in the second direction between the conductor line 11 and the second resonator 13 is, for example, smaller than the width of the conductor line 11 in the second direction.

The transmission line according to the present embodiment, includes the two resonators provided to interpose the conductor line 11 between the two resonators. Therefore, both of the resonators can cancel radiation with respect to a current flowing through both ends of the conductor line 11 in the first direction, in a balanced manner. Therefore, the radiation loss can be further inhibited.

The transmission line according to the present embodiment (the second embodiment), includes the second resonator 13 added in comparison to that according to the first embodiment. As is apparent from FIG. 7, adding the resonator further inhibits the radiation loss in comparison to that according to the first embodiment. As a result, the insertion loss is also inhibited. Note that, it can be considered that the reason why the heat intrusion amount slightly increases in comparison to that according to the first embodiment is that the propagation of heat through the second resonator 13 is added.

The transmission line according to the present embodiment, can achieve a heat insulating transmission line having smaller insertion loss and an excellent heat insulating characteristic.

Third Embodiment

A transmission line according to the present embodiment, is similar to that according to the second embodiment except that the respective widths of a third region and a fourth region are wider than the width of a first intermediate region located between the third region and the fourth region in a second conductor line. The descriptions of details that duplicate with respect to the second embodiment will be partially omitted below.

Figure 9A:
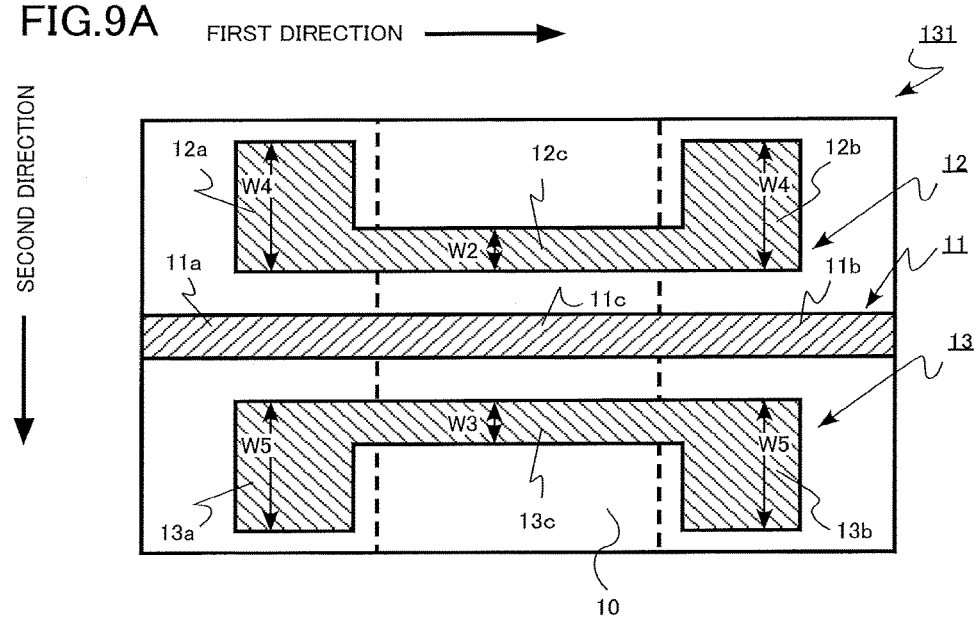
FIGS. 9A and 9B are schematic views of a circuit portion of a transmission line according to a third embodiment.
Figure 9B:
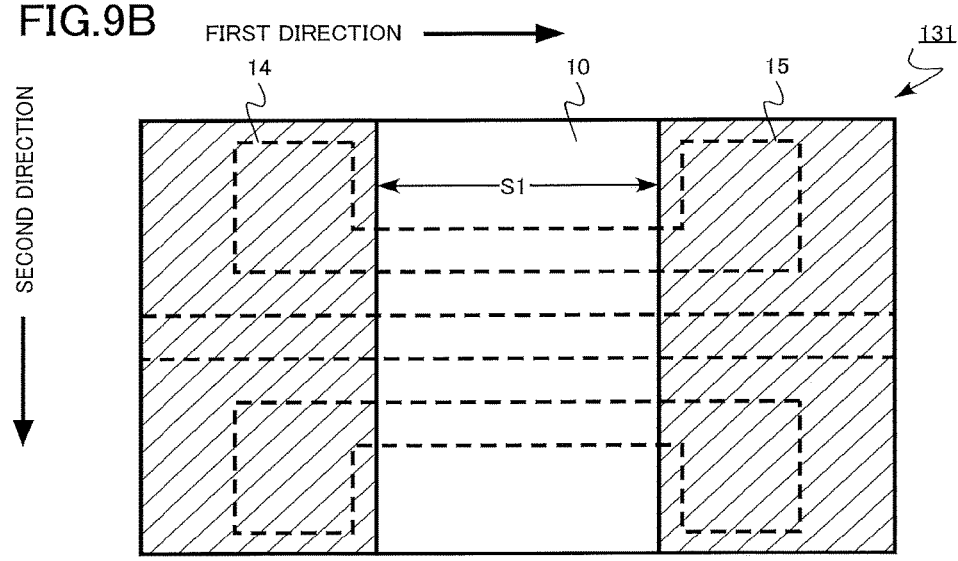

FIGS. 9A and 9B are schematic views of a circuit portion 131 of the transmission line according to the present embodiment. FIG. 9A is a top view, and FIG. 9B is a bottom view. FIGS. 9A and 9B each also illustrate a member on the side of the opposite surface, with a broken line.

The circuit portion 131 according to the present embodiment, includes a dielectric substrate 10, a conductor line 11 (a first conductor line), a first resonator 12 (the second conductor line), a second resonator 13 (a third conductor line), a first ground layer 14 (a first conductor layer), and a second ground layer 15 (a second conductor layer). The circuit portion 131 according to the present embodiment, has a microstrip line structure.

The respective widths (W4 in FIG. 9A) of an input-side region 12a (the third region) and an output-side region 12b (the fourth region) are wider than the width (W2 in FIG. 9A) of an intermediate region 12c (the first intermediate region) in the first resonator 12 in a second direction. The respective widths (W5 in FIG. 9A) of an input-side region 13a and an output-side region 13b are wider than the width (W3 in FIG. 9A) of an intermediate region 13c in the second resonator 13 in the second direction.

According to the present embodiment, the capacitance between the first resonator 12, the first ground layer 14, and the second ground layer 15, increases. In addition, the capacitance between the second resonator 13, the first ground layer 14, and the second ground layer 15, increases. Therefore, the respective coupling characteristics between the conductor line 11 and the first resonator 12 and between the conductor line 11 and the second resonator 13, improve. Therefore, the radiation loss can further reduce.

In addition, according to the present embodiment, a resonator length can shorten so that the distance (S1 in FIG. 9B) in the first direction between the first ground layer 14 and the second ground layer 15 can reduce. Therefore, conduction loss can also reduce.

The transmission line according to the present embodiment (the third embodiment), includes the respective both end portions of the first resonator 12 and the second resonator 13, each having a width wider than that according to the second embodiment. As is apparent from FIG. 7, widening the respective both end portions of the first resonator 12 and the second resonator 13 in width, further inhibits the radiation loss in comparison to that according to the second embodiment. As a result, the insertion loss is also inhibited. Note that, it can be considered that the reason why the heat intrusion amount slightly increases in comparison to that according to the second embodiment is that the propagation of heat through each of the first resonator 12 and the second resonator 13 increases.

FIGS. 10A and 10B are schematic views of a circuit portion 132 of a transmission line according to a modification of the present embodiment. FIG. 10A is a top view, and FIG. 10B is a bottom view. Note that, FIGS. 10A and 10B each also illustrate a member on the side of the opposite surface, with a broken line.

The transmission line according to the modification, is similar to the transmission line according to the present embodiment except that an input-side region 12a and an output-side region 12b in a first resonator 12 each include a line that has been bent and an input-side region 13a and an output-side region 13b in a second resonator 13 each include a line that has been bent. Even the transmission line according to the modification, achieves an effect similar to that of the transmission line 100 according to the present embodiment.

The transmission line according to the present embodiment, can achieve a heat insulating transmission line having smaller insertion loss and an excellent heat insulating characteristic.

Fourth Embodiment

A transmission line according to the present embodiment, is similar to that according to the third embodiment except that the width of a second intermediate region located between a first region and a second region is narrower than the respective widths of the first region and the second region in a first conductor line. The descriptions of details that duplicate with respect to the third embodiment will be partially omitted below.

FIGS. 11A and 11B are schematic views of a circuit portion 141 of the transmission line according to the present embodiment. FIG. 11A is a top view, and FIG. 11B is a bottom view. FIGS. 11A and 11B each also illustrate a member on the side of the opposite surface, with a broken line.

The circuit portion 141 according to the present embodiment, includes a dielectric substrate 10, a conductor line 11 (the first conductor line), a first resonator 12 (a second conductor line), a second resonator 13 (a third conductor line), a first ground layer 14 (a first conductor layer), and a second ground layer 15 (a second conductor layer). The circuit portion 141 according to the present embodiment, has a microstrip line structure.

The width (W1 in FIG. 11A) of an intermediate region 11c (the second intermediate region) in the conductor line 11 in the second direction is narrower than the respective widths (W6 in FIG. 11A) of an input-side region 11a (the first region) and an output-side region 11b (the second region) in the second direction.

According to the present embodiment, the width of the conductor line 11 narrows in the intermediate region 11c. Therefore, the propagation of heat through the conductor line 11 reduces. Therefore, the amount of a heat inflow can further reduce. In addition, the intermediate region 11c in the conductor line 11 is a region in which a current decreases so that influence on transmission loss is small.

The transmission line according to the present embodiment (the fourth embodiment), includes the intermediate region 11c in the conductor line 11 narrow in width in comparison to that according to the third embodiment. As is apparent from FIG. 7, the heat intrusion amount is inhibited in comparison to that according to the third embodiment. In addition, the insertion loss slightly increases in comparison to that according to the third embodiment.

The transmission line according to the present embodiment, can achieve a heat insulating transmission line having a smaller heat intrusion amount and an excellent heat insulating characteristic.

Fifth Embodiment

A transmission line according to the present embodiment, is similar to that according to the third embodiment except that a first conductor line includes a slit between a first region and a second region and a second conductor line includes a slit between a third region and a fourth region. The descriptions of details that duplicate with respect to the third embodiment will be partially omitted below.

Figure 12A:
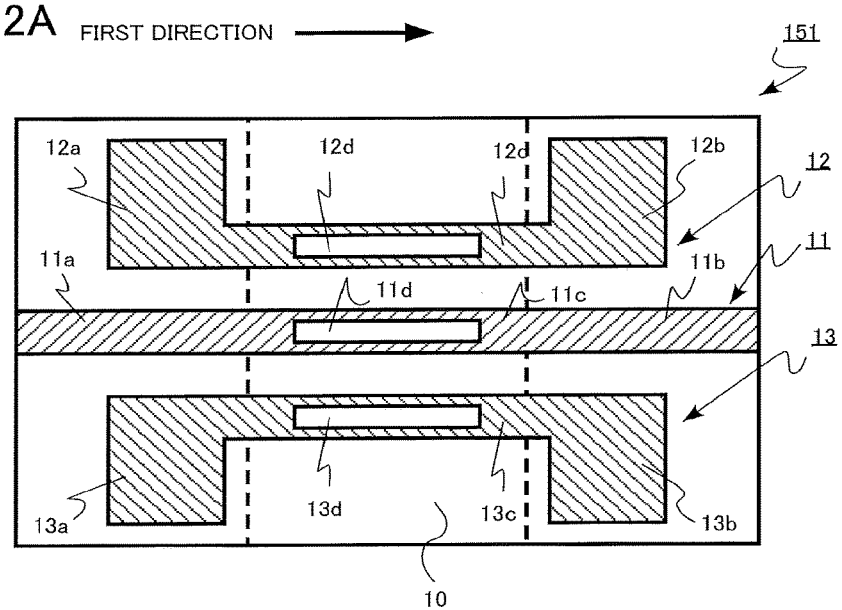
FIGS. 12A and 12B are schematic views of a circuit portion of a transmission line according to a fifth embodiment.
Figure 12B:
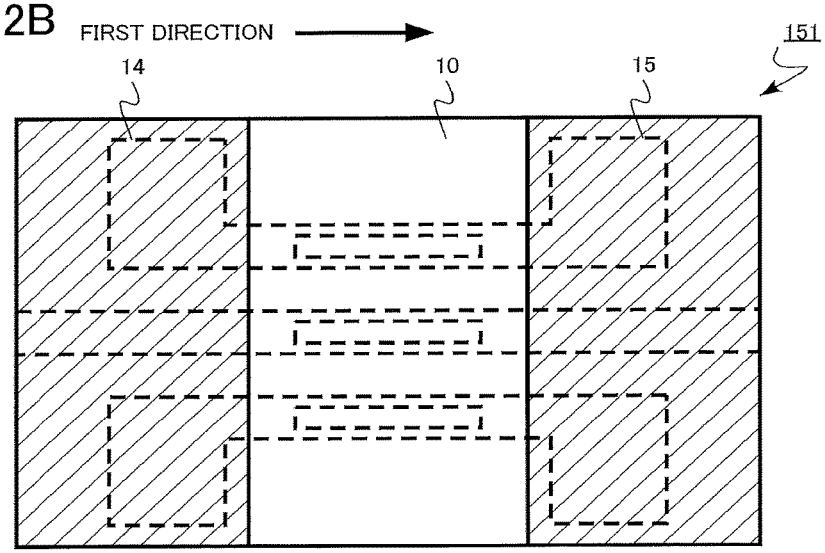

FIGS. 12A and 12B are schematic views of a circuit portion 151 of a transmission line according to the present embodiment. FIG. 12A is a top view, and FIG. 12B is a bottom view. FIGS. 12A and 12B each also illustrate a member on the side of the opposite surface, with a broken line.

The circuit portion 151 according to the present embodiment, includes a dielectric substrate 10, a conductor line 11 (the first conductor line), a first resonator 12 (the second conductor line), a second resonator 13 (a third conductor line), a first ground layer 14 (a first conductor layer), and a second ground layer 15 (a second conductor layer). The circuit portion 151 according to the present embodiment, has a microstrip line structure.

The conductor line 11 includes the slit 11d in an intermediate region 11c (a second intermediate region) between an input-side region 11a (the first region) and an output-side region 11b (the second region). In addition, the first resonator 12 includes the slit 12d in an intermediate region 12c (a first intermediate region) between an input-side region 12a (the third region) and an output-side region 12b (the fourth region). Furthermore, the second resonator 13 includes a slit 13d in an intermediate region 13c between an input-side region 13a and an output-side region 13b.

According to the present embodiment, forming the slits in the intermediate region 11c of the conductor line 11, the intermediate region 12c of the first resonator 12, and the intermediate region 13c of the second resonator 13, can reduce a heat inflow amount. In addition, the intermediate region 11c of the conductor line 11, the intermediate region 12c of the first resonator 12, and the intermediate region 13c of the second resonator 13, each are a region in which a current decreases so that influence on transmission loss is small.

The transmission line according to the present embodiment (the fifth embodiment), includes the respective slits provided in the conductor line 11, the first resonator 12, and the second resonator 13, in comparison to that according to the third embodiment. As is apparent from FIG. 7, the heat intrusion amount is inhibited in comparison to that according to the third embodiment. In addition, no influence on the insertion loss is observed in comparison to that according to the third embodiment.

The transmission line according to the present embodiment, can achieve a heat insulating transmission line having a smaller heat intrusion amount and an excellent heat insulating characteristic.

Sixth Embodiment

A transmission line according to the present embodiment, is different from that according to the third embodiment in that a first conductor line, a first conductor layer, and a second conductor layer are located on the side of a first surface of a dielectric substrate and a second conductor line is located on the side of a second surface of the dielectric substrate. The descriptions of details that duplicate with respect to the third embodiment will be partially omitted below.

Figure 13A:
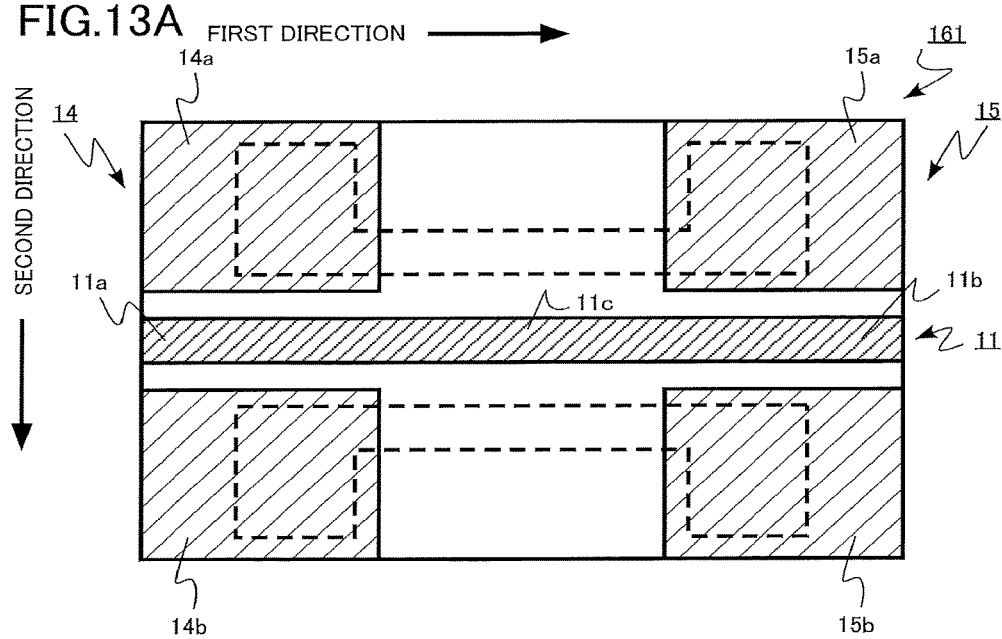
FIGS. 13A and 13B are schematic views of a circuit portion of a transmission line according to a sixth embodiment.
Figure 13B:
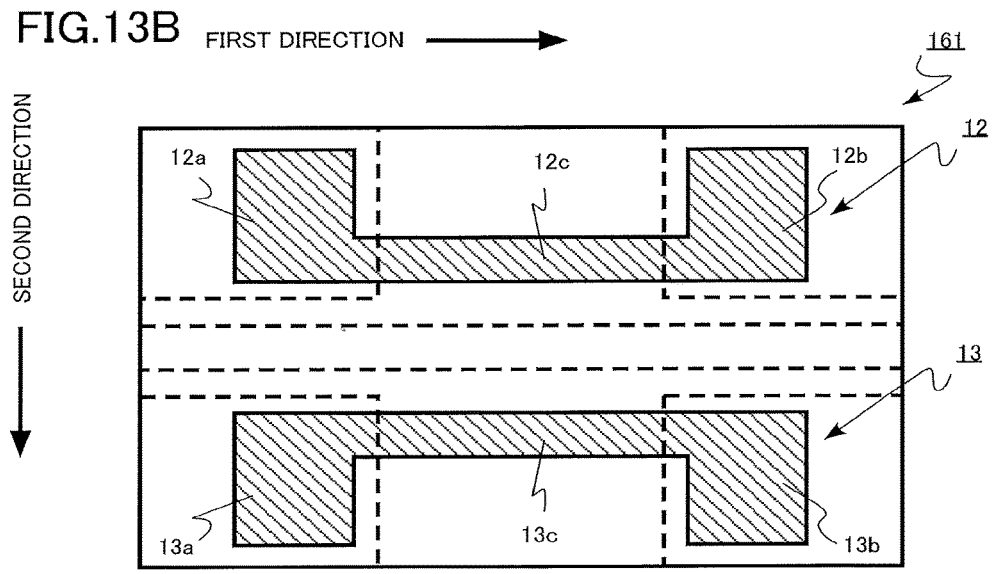

FIGS. 13A and 13B are schematic views of a circuit portion 161 of the transmission line according to the present embodiment. FIG. 13A is a top view, and FIG. 13B is a bottom view. FIGS. 13A and 13B each also illustrate a member on the side of the opposite surface, with a broken line.

The circuit portion 161 according to the present embodiment, includes the dielectric substrate 10, a conductor line 11 (the first conductor line), a first resonator 12 (the second conductor line), a second resonator 13 (a third conductor line), a first ground layer 14 (the first conductor layer), and a second ground layer 15 (the second conductor layer). The circuit portion 161 according to the present embodiment, has a structure in which conductor lines each serving as a resonator are provided on the side of a lower surface of a coplanar line structure.

The conductor line 11, the first ground layer 14, and the second ground layer 15 are located on the side of an upper surface of the dielectric substrate 10. The first ground layer 14 includes a first layer 14a and a second layer 14b. The second ground layer 15 includes a first layer 15a and a second layer 15b.

An input-side region 11a in the conductor line 11 is located between the first layer 14a and the second layer 14b. An output-side region 11b in the conductor line 11 is provided between the first layer 15a and the second layer 15b.

The transmission line according to the present embodiment, can achieve a heat insulating transmission line having a small heat intrusion amount and an excellent heat insulating characteristic, similarly to that according to the third embodiment.

Seventh Embodiment

A signal processing device according to the present embodiment, includes: an input line; an output line; an electronic circuit coupled between the input line and the output line; and a transmission line including: a first conductor layer; a second conductor layer spaced apart from the first conductor layer; a first conductor line including a first region facing the first conductor layer and a second region facing the second conductor layer, the first conductor line being spaced apart from the first conductor layer and the second conductor layer, the first conductor line extending in a first direction; and a second conductor line spaced apart from the first conductor layer, the second conductor layer, and the first conductor line, the second conductor line extending in the first direction, the second conductor line being shorter than the first conductor line in the first direction in length, the transmission line being coupled to at least any one of between the input line and the electronic circuit and between the output line and the electronic circuit. The transmission line according to the present embodiment, includes any of the transmission lines according to the first to sixth embodiments. Therefore, the detailed description of the transmission line will be omitted.

Figure 14:
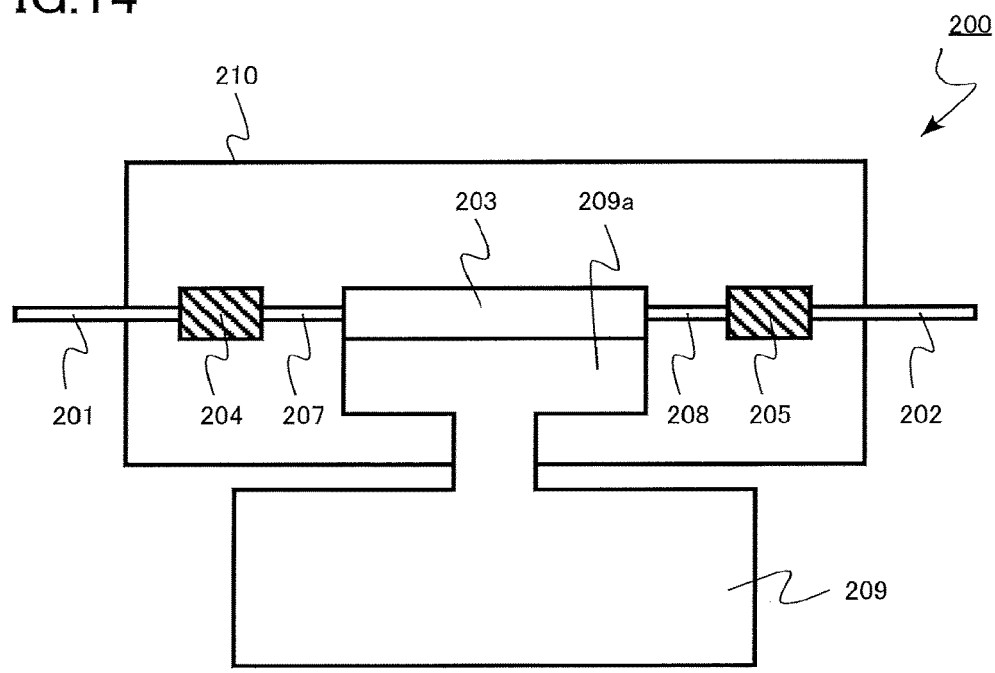
FIG. 14 is a schematic sectional view of a signal processing device according to a seventh embodiment.

FIG. 14 is a schematic sectional view of the signal processing device 200 according to the present embodiment.

The signal processing device 200 according to the present embodiment, includes the input line 201, the output line 202, a superconducting filter 203 (the electronic circuit), a first transmission line 204 (the transmission line), a second transmission line 205 (the transmission line), a first connecting line 207, a second connecting line 208, a refrigerator 209, and a vacuum vessel 210 (a casing).

The input line 201, the output line 202, the first connecting line 207, and the second connecting line 208 each include, for example, a coaxial cable. The first transmission line 204 and the second transmission line 205 each include any of the heat insulating transmission lines according to the first to sixth embodiments. The first transmission line 204 is electromagnetically coupled between the input line 201 and the superconducting filter 203. The second transmission line 205 is electromagnetically coupled between the output line 202 and the superconducting filter 203.

With the transmission line according to the modification of the first embodiment illustrated in FIGS. 2A and 2B for the first transmission line 204 or the second transmission line 205, the transmission line and the superconducting filter 203 can be coupled with the bonding wire.

The superconducting filter 203 (the electronic circuit), the first connecting line 207, the second connecting line 208, the first transmission line 204, and the second transmission line 205, are located in the vacuum vessel 210. The vacuum vessel 210 can maintain the inside at pressure lower than atmospheric pressure.

A cold head 209a of the refrigerator 209 cools the superconducting filter 203. The superconducting filter 203 is electromagnetically coupled between the input line 201 and the output line 202. A high-frequency signal transmitted from the outside of the vacuum vessel 210 is input into the superconducting filter 203 through the input line 201, the first transmission line 204, and the first connecting line 207. The high-frequency signal output from the superconducting filter 203 is transmitted to the outside of the vacuum vessel 210 through the second connecting line 208, the second transmission line 205, and the output line 202.

For the superconducting filter 203 that processes the high-frequency signal at a low temperature, the superconducting filter 203 is housed in the vacuum vessel 210 and then the refrigerator 209 is used to cool the superconducting filter 203. When heat intrudes from the outside through, for example, the input line 201 or the output line 202, the load of the refrigerator 209 increases and power consumption increases to cause a problem.

The signal processing device 200 according to the present embodiment, includes any of the heat insulating transmission lines each having the excellent heat insulating characteristic according to the first to sixth embodiments, used for the first transmission line 204 and the second transmission line 205. Therefore, a heat inflow into the superconducting filter 203 is inhibited. Therefore, the power consumption of the signal processing device 200 can be inhibited.

Eighth Embodiment

A signal processing device according to the present embodiment, is different from that according to the seventh embodiment in that an electronic circuit includes a power amplifier that operates at a high temperature. A transmission line according to the present embodiment includes any of the transmission lines according to the first to sixth embodiments. Therefore, the detailed description of the transmission line will be omitted.

Figure 15:
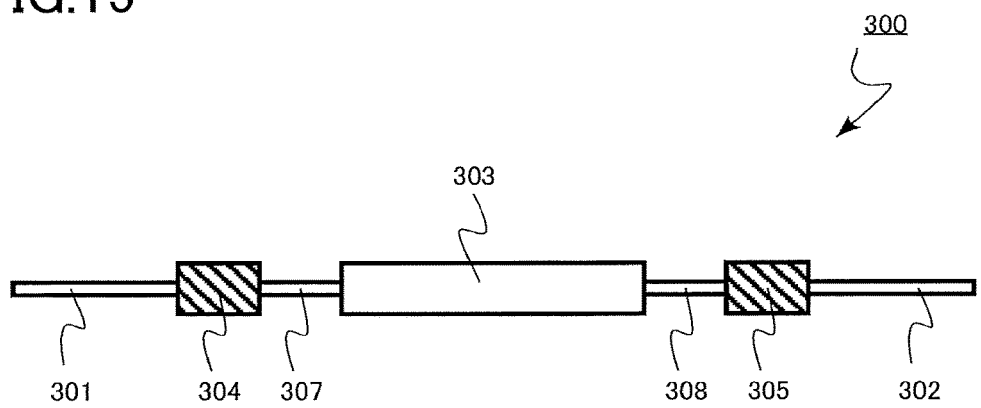
FIG. 15 is a schematic sectional view of a signal processing device according to an eighth embodiment.

FIG. 15 is a schematic sectional view of the signal processing device 300 according to the present embodiment.

The signal processing device 300 according to the present embodiment, includes an input line 301, an output line 302, the power amplifier 303 (the electronic circuit), a first transmission line 304, a second transmission line 305, a first connecting line 307, and a second connecting line 308.

The input line 301, the output line 302, the first connecting line 307, and the second connecting line 308 each include, for example, a coaxial cable. The first transmission line 304 and the second transmission line 305 each include any of the heat insulating transmission lines according to the first to sixth embodiments. The first transmission line 304 is electromagnetically coupled between the input line 301 and the power amplifier 303. The second transmission line 305 is electromagnetically coupled between the output line 302 and the power amplifier 303.

The power amplifier 303 is electromagnetically coupled between the input line 301 and the output line 302. A signal transmitted from the outside is input into the power amplifier 303 through the input line 301, the first transmission line 304, and the first connecting line 307. The signal output from the power amplifier 303 is transmitted to the outside through the second connecting line 308, the second transmission line 305, and the output line 302.

The power amplifier 303 has large power consumption and thus has a high heating value in the circuit. Therefore, the temperature of the circuit becomes high. When the heat propagates to the outside through, for example, the input line 301 or the output line 302, a characteristic of an electronic circuit coupled outside degrades due to the high temperature, to cause a problem.

The signal processing device 300 according to the present embodiment, includes any of the heat insulating transmission lines each having the excellent heat insulating characteristic according to the first to sixth embodiments, used for the first transmission line 304 and the second transmission line 305. Therefore, the heat from the power amplifier 303 is inhibited from propagating to the outside. Therefore, the circuit operation of the electronic circuit outside the signal processing device 300, can be stabilized.

According to the first to sixth embodiments, the case where the first resonator 12 or the second resonator 13 has the regions facing the first ground layer 14 and the second ground layer 15, has been exemplarily described, but a configuration including no regions facing the ground layers can be provided.

According to the second to sixth embodiments, the case where the respective patterns of the conductor line 11, the first resonator 12, the second resonator 13, the first ground layer 14, and the second ground layer 15, have symmetry, has been exemplarily described, but the patterns may be asymmetric.

According to the first to sixth embodiments, the case where the first resonator 12 and the second resonator 13 each include the half-wavelength resonator, has been exemplarily described, but the first resonator 12 or the second resonator 13 may include a resonator having at least one wavelength.

According to the first to sixth embodiments, the case where at least one of the conductor line 11, the first resonator 12, the second resonator 13, the first ground layer 14, and the second ground layer 15, is located on a different plane, has been exemplarily described, but a structure including all the above located on the same plane, may be provided.

According to the seventh and eighth embodiments, the superconducting filter and the power amplifier each have been exemplarily described as the electronic circuit in the signal processing device, but the electronic circuit is not limited to the examples. For example, a different electronic circuit, such as a superconducting quantum interference fluxmeter, can be applied to the electronic circuit required to block the heat with respect to the outside.

While certain embodiments have been described, these embodiments have been presented by way of example only, and are not intended to limit the scope of the inventions. Indeed, the transmission lines and the signal processing devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:
1. A transmission line comprising:
a first conductor layer;
a second conductor layer spaced apart from the first conductor layer;
a first conductor line including a first region facing the first conductor layer and a second region facing the second conductor layer, the first conductor line being spaced apart from the first conductor layer and the second conductor layer, the first conductor line extending in a first direction; and a second conductor line spaced apart from the first conductor layer, the second conductor layer, and the first conductor line, the second conductor line extending in the first direction, the second conductor line being shorter than the first conductor line in the first direction in length, wherein the first conductor layer and the second conductor layer are fixed at a ground potential.

2. The transmission line according to claim 1, wherein the first conductor layer and the second conductor layer are located in substantially the same plane substantially parallel to the first direction.

3. A transmission line comprising:
a first conductor layer;
a second conductor layer spaced apart from the first conductor layer;
a first conductor line including a first region facing the first conductor layer and a second region facing the second conductor layer, the first conductor line being spaced apart from the first conductor layer and the second conductor layer, the first conductor line extending in a first direction; and
a second conductor line spaced apart from the first conductor layer, the second conductor layer, and the first conductor line, the second conductor line extending in the first direction, the second conductor line being shorter than the first conductor line in the first direction in length,
wherein a distance between the first conductor layer and the second conductor layer is shorter than a half wavelength of a signal transmitted to the first conductor line.

4. The transmission line according to claim 1, wherein the second conductor line is a both-sides open resonator electromagnetically coupled to the first conductor line.

5. A transmission line comprising:
a first conductor layer;
a second conductor layer spaced apart from the first conductor layer;
a first conductor line including a first region facing the first conductor layer and a second region facing the second conductor layer, the first conductor line being spaced apart from the first conductor layer and the second conductor layer, the first conductor line extending in a first direction; and
a second conductor line spaced apart from the first conductor layer, the second conductor layer, and the first conductor line, the second conductor line extending in the first direction, the second conductor line being shorter than the first conductor line in the first direction in length,
wherein the second conductor line is a both-sides open resonator electromagnetically coupled to the first conductor line, and
the second conductor line is a half-wavelength resonator.

6. A transmission line comprising:
a first conductor layer;
a second conductor layer spaced apart from the first conductor layer;
a first conductor line including a first region facing the first conductor layer and a second region facing the second conductor layer, the first conductor line being spaced apart from the first conductor layer and the second conductor layer, the first conductor line extending in a first direction; and
a second conductor line spaced apart from the first conductor layer, the second conductor layer, and the first conductor line, the second conductor line extending in the first direction, the second conductor line being shorter than the first conductor line in the first direction in length,
wherein a distance between the first conductor line and the second conductor line is smaller than a width of the first conductor line.

7. A transmission line comprising:
a first conductor layer;
a second conductor layer spaced apart from the first conductor layer;
a first conductor line including a first region facing the first conductor layer and a second region facing the second conductor layer, the first conductor line being spaced apart from the first conductor layer and the second conductor layer, the first conductor line extending in a first direction; and
a second conductor line spaced apart from the first conductor layer, the second conductor layer, and the first conductor line, the second conductor line extending in the first direction, the second conductor line being shorter than the first conductor line in the first direction in length,
wherein the second conductor line includes a third region facing the first conductor layer and a fourth region facing the second conductor layer.

8. The transmission line according to claim 7, wherein a width of the third region and a width of the fourth region are wider than a width of a first intermediate region located between the third region and the fourth region in the second conductor line.

9. The transmission line according to claim 7, wherein the second conductor line includes a slit between the third region and the fourth region.

10. A transmission line comprising:
a first conductor layer;
a second conductor layer spaced apart from the first conductor layer;
a first conductor line including a first region facing the first conductor layer and a second region facing the second conductor layer, the first conductor line being spaced apart from the first conductor layer and the second conductor layer, the first conductor line extending in a first direction; and
a second conductor line spaced apart from the first conductor layer, the second conductor layer, and the first conductor line, the second conductor line extending in the first direction, the second conductor line being shorter than the first conductor line in the first direction in length,
wherein a width of a second intermediate region located between the first region and the second region is narrower than a width of the first region and a width of the second region in the first conductor line.

11. The transmission line according to claim 1, wherein the first conductor line includes a slit between the first region and the second region.

12. A transmission line comprising:
a first conductor layer;
a second conductor layer spaced apart from the first conductor layer;
a first conductor line including a first region facing the first conductor layer and a second region facing the second conductor layer, the first conductor line being spaced apart from the first conductor layer and the second conductor layer, the first conductor line extending in a first direction;

a second conductor line spaced apart from the first conductor layer, the second conductor layer, and the first conductor line, the second conductor line extending in the first direction, the second conductor line being shorter than the first conductor line in the first direction in length; and a third conductor line spaced apart from the first conductor layer, the second conductor layer, and the first conductor line, the first conductor line being interposed between the second conductor line and the third conductor line, the third conductor line extending in the first direction, the third conductor line being shorter than the first conductor line in the first direction in length.

13. The transmission line according to claim 12, wherein the third conductor line is a both-sides open resonator electromagnetically coupled to the first conductor line.

14. A transmission line comprising:
a first conductor layer;
a second conductor layer spaced apart from the first conductor layer;
a first conductor line including a first region facing the first conductor layer and a second region facing the second conductor layer, the first conductor line being spaced apart from the first conductor layer and the second conductor layer, the first conductor line extending in a first direction;
a second conductor line spaced apart from the first conductor layer, the second conductor layer, and the first conductor line the second conductor line extending in the first direction, the second conductor line being shorter than the first conductor line in the first direction in length; and
a dielectric substrate including a first surface and a second surface,
wherein the first conductor line and the second conductor line are located on a side of the first surface, and
the first conductor layer and the second conductor layer are located on a side of the second surface.

15. A transmission line comprising:
a first conductor layer;
a second conductor layer spaced apart from the first conductor layer;
a first conductor line including a first region facing the first conductor layer and a second region facing the second conductor layer, the first conductor line being spaced apart from the first conductor layer and the second conductor layer, the first conductor line extending in a first direction;
a second conductor line spaced apart from the first conductor layer, the second conductor layer, and the first conductor line, the second conductor line extending in the first direction, the second conductor line being shorter than the first conductor line in the first direction in length; and
a dielectric substrate including a first surface and a second surface,
wherein the first conductor line, the first conductor layer, and the second conductor layer, are located on a side of the first surface, and
the second conductor line is located on a side of the second surface.

16. A signal processing device comprising:
an input line;
an output line;
an electronic circuit coupled between the input line and the output line; and
a transmission line coupled at least one of between the input line and the electronic circuit and between the output line and the electronic circuit, the transmission line including:
a first conductor layer;
a second conductor layer spaced apart from the first conductor layer;
a first conductor line including a first region facing the first conductor layer and a second region facing the second conductor layer, the first conductor line being spaced apart from the first conductor layer and the second conductor layer, the first conductor line extending in a first direction;
a second conductor line spaced apart from the first conductor layer, the second conductor layer, and the first conductor line, the second conductor line extending in the first direction, the second conductor line being shorter than the first conductor line in the first direction in length;
a casing configured to maintain an inside at pressure lower than atmospheric pressure; and
a refrigerator,
wherein the electronic circuit and the transmission line are located in the casing, and
the refrigerator cools the electronic circuit.

17. The signal processing device according to claim 16, wherein the electronic circuit includes a superconducting filter.

* * * * *